United States Patent [19]
Bell et al.

[11] 4,428,987
[45] Jan. 31, 1984

[54] PROCESS FOR IMPROVING COPPER-EPOXY ADHESION

[75] Inventors: James P. Bell; Jae M. Park, both of Storrs, Conn.

[73] Assignee: Shell Oil Company, Houston, Tex.

[21] Appl. No.: 372,588

[22] Filed: Apr. 28, 1982

[51] Int. Cl.³ ............................................. B05D 3/14
[52] U.S. Cl. ................................ 427/327; 148/6.14 R; 156/330; 204/29; 204/140
[58] Field of Search ...................... 427/327, 386, 388.2; 204/29, 140; 148/6.14 R; 156/330

[56] References Cited

U.S. PATENT DOCUMENTS

| | | | |
|---|---|---|---|
| 2,640,037 | 5/1953 | Parry et al. | 260/42 |
| 2,651,589 | 9/1953 | Shokal et al. | 154/140 |
| 2,658,885 | 11/1953 | D'Alelio | 260/53 |
| 3,336,241 | 8/1967 | Shokal | 260/2 |
| 3,477,990 | 11/1969 | Dante | 260/47 |
| 3,645,772 | 2/1972 | Jones | 427/327 |
| 3,753,882 | 8/1973 | Missel | 204/140 |
| 3,756,984 | 9/1973 | Klaren et al. | 260/47 EC |
| 3,762,939 | 10/1973 | Hunter | 427/327 |

Primary Examiner—Norman Morgenstern
Assistant Examiner—Janyce A. Bell
Attorney, Agent, or Firm—Norris E. Faringer

[57] ABSTRACT

The present invention is directed to a method for improving the adhesion of epoxy resins to copper substrates which comprises pretreating the copper substrate with a solution of a suitable pretreatment compound such as a benzotriazole, benzothiazole, substituted benzotriazoles, etc.

9 Claims, No Drawings

PROCESS FOR IMPROVING COPPER-EPOXY ADHESION

FIELD OF THE INVENTION

The present invention is directed to improving the adhesion of epoxy resin adhesives to copper substrates.

BACKGROUND OF THE INVENTION

Epoxy resins rank among the most popular types of adhesives, especially for use in metal-to-metal joining applications. In these applications, typified by the aircraft industries, epoxy resin adhesives offer a number of advantages over the alternative materials used for joining, e.g., ease of application, low temperature and pressure for curing, and high strength.

When two materials are bonded, the resultant composite has, in general, five elements: adherent No. 1/interface/adhesive/interface/adherent No. 2. The strength of the adhesive joint will be the strength of its weaker member. With stronger substrates, the failure will be either adhesive at an interface or cohesive within the glue. Failure will not be at the interface if the adherend surface has been properly prepared and the adhesive wets the adherend.

For many metals, the adhesion between the metal and epoxy adhesive is strong and durable. But it has been noted that difficulty is sometimes experienced during extended aging under atmospheric conditions. Oxidative degradation of the adhesive is initiated by several of the metals. Results of many years of experience and testing has generally shown that copper gives the poorest durability among the common metals. Copper-epoxy adhesion is important for many industrial applications, as for example, the joining of copper foil to fiberglass mat with an epoxy adhesive. In contrast to the good bond durability of aluminum and silver, the adhesive bond to copper fails rapidly in water or in highly humid environments. This poor durability of copper-epoxy adhesion is generally attributable to the unique properties of the copper oxides. In order to promote strong and durable bonding between the copper and the epoxy adhesive, several surface treatments have been introduced. One method utilizes a method wherein the vapor degreased copper surface is etched with a solution of sodium chlorite. This method is not suitable because the joint fails easily under shear stress and is unsuitable on thin copper films because of the high relative dimensional change caused by the etching. Another method utilizes a treatment with aqueous alkaline permanganate solution. Both of these methods fail to improve the water resistance of the copper-epoxy adhesive bond.

There is therefore adequate incentive to find a method, preferably a pretreatment method, for improving the bond strength of the copper-epoxy adhesive bond, particularly in moist environments.

SUMMARY OF THE INVENTION

The present invention is directed improving the epoxy bonding to copper. More particularly, the present invention provides a process for improving the adhesion of epoxy resins to copper substrates by coating the copper substrate with a benzotriazole, substituted-benzotriazole, benzothiazole, substituted benzothiazole or diazole, etc.

DESCRIPTION OF THE PREFERRED EMBODIMENTS

The present invention is directed to a method for improving the adhesion of epoxy resins to copper substrates which comprises pretreating the copper substrate with a solution of a suitable pretreatment compound such as a benzotriazole, benzothiazole, substituted benzotriazole, etc.

The present invention is particularly suitable for improving the bond strength between a copper substrate and a cured epoxy resin when the bond is subsequently exposed to humid conditions, especially when immersed in water. Outstanding adhesion is achieved when the pretreated copper-epoxy bond is exposed to hot or boiling water.

As a special embodiment, before pretreatment with the benzotriazole compounds, the copper surface is electrically pretreated by first reducing the copper surface by applying a cathodic potential at about 1 to 15 volts for from about 1 second to about 15 minutes. The benzotriazole or related compound is then dissolved in the electrolyte solution and the requisite complex formed in the copper surface. Enhanced adhesion is observed, particularly in boiling water, when this cathodic polarization technique is applied prior to the establishment of the epoxide-copper bond. Suitable electrolyte solutions include the alkali metal salts and hydroxides such as NaCl, KCl, NaOH and KOH. Suitable concentrations of such salts will range from about 0.01 to about 5% by weight, with from about 0.1% to about 0.5% being preferred.

Pretreatment Compounds

Suitable copper pretreatment compounds have the following generalized formula:

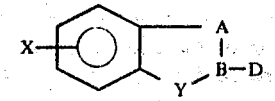

Wherein A is —N= or —S—, B is a —N= or —C=, Y is a —N= or HN=, D is H, —SH, —SR, or

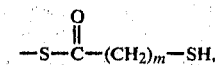

wherein R is an alkyl or aryl radical, and m is an integer from 0 to 10, and X is H, —NH$_2$,

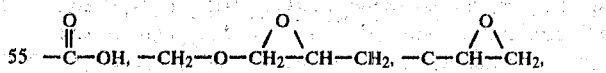

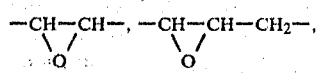

or —OH.

It is relevant to note that non-interfering substituents are selected. For example, if D is —SH or —SR, then X should not contain a

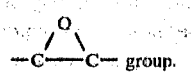

group.

Preferred benzothiazoles have the general formula:

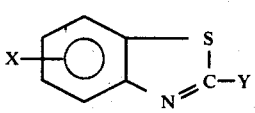

Y is —SH, R, or —S—R and wherein R and X are hereinbefore described.

Preferred benzotriazoles have the general formula:

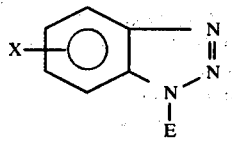

wherein E is hydrogen or a lower alkyl and X is hereinbefore described.

Especially preferred benzotriazoles include among others, benzotriazole, amino-benzotriazole, hydroxyl-benzotriazole, glycidoxy-benzotriazole, carboxyl-benzotriazole and nitro-benzotriazole.

In general, the copper, which may be previously degreased, cleaned, polished, buffed, etc., is immersed in a solution of one or more of the above benzotriazole or benzothiazole for a time sufficient to deposit a complex coating. The strength of the solution will vary widely, but will usually range from about a 0.001 to about 0.1 molar solution of the compound. Suitable solvents include water; ketones such as acetone, MIBK, MEK, etc., alcohols, glycol ethers, esters and the like. Preferred are the polar solvents. The copper substrate is immersed in the solution for from about 1 second to about 1 hour, although longer or shorter times may be utilized depending on the pretreatment of the copper substrate, the particular benzotrizole, the solution strength, solution temperature epoxy system to be employed, etc. In general, the solution bath will range from about 15° C. to about 100° C., and may be near the boiling point of the solvent, and the time of immersion will range from about 1 minute to about 15 minutes.

After the copper substrate has been treated by suitable means such as dipping, spraying, painting, etc. with the solution, the substrate is dried and an epoxy-curing agent and/or curing accelerators blend is applied thereto using any conventional technique such as painting, dipping, doctor blade, fluidized bed, electrostatic, etc., and cured. After the substrate has been treated with the coupling agent solution, the substrate may be rinsed in water or other suitable solvent.

The epoxy adhesive which may be employed forms no part of the present invention and any of the epoxy-curing agent-curing accelerator compositions normally utilized as an adhesive or coating for metal substrates, especially copper substrates, are suitable.

Polyepoxides

Suitable polyepoxides which may be used in adhesive compositions include those compounds possessing more than one vic-epoxy group per molecule, i.e., more than one

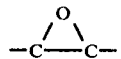

group per molecule. These polyepoxides are saturated or unsaturated, aliphatic, cycloaliphatic, aromatic or heterocyclic, and are substituted, if desired, with non-interfering substituents, such as halogen atoms, hydroxy groups, ether radicals, and the like. Polyepoxides employed are monomeric or polymeric. Preferred liquid polyepoxides include the so-called liquid glycidyl polyethers of polyhydric phenols and polyhydric alcohols. As used herein the terms "epoxide equivalent weight" and "weight per epoxide" (WPE) refer to the average molecular weight of the polyepoxide molecule divided by the average number of oxirane groups present in the molecule.

Various examples of polyepoxides that may be used in this invention are given in U.S. Pat. No. 3,477,990 (e.g., column 2, line 39 to column 4, line 75) and it is to be understood that so much of the disclosure of that patent relative to examples of polyepoxides is incorporated by reference into this specification.

Preferred polyepoxides are the glycidyl polyethers of polyhydric phenols and polyhydric alcohols, especially the glycidyl polyethers of 2,2-bis(4-hydroxyphenyl)propane having an average molecular weight between about 300 and 3,000 and an epoxide equivalent weight (WPE) between about 140 and 2,000. Especially preferred are the diglycidyl polyethers of 2,2-bis(4-hydroxyphenyl)propane having a WPE between about 140 and 500 and an average molecular weight of from about 300 to about 900.

Other suitable epoxy compounds include those compounds derived from polyhydric phenols and having at least one vicinal epoxy group wherein the carbon-to-carbon bonds within the six-membered ring are saturated. Such epoxy resins may be obtained by at least two well-known techniques, i.e., by the hydrogenation of glycidyl polyethers of polyhydric phenols or (2) by the reaction of hydrogenated polyhydric phenols with epichlorohydrin in the presence of a suitable catalyst such as Lewis acids, i.e., boron trihalides and complexes thereof, and subsequent dehydrochlorination in an alkaline medium. The method of preparation forms no part of the present invention and the resulting saturated epoxy resins derived by either method are suitable in the present compositions.

Briefly, the first method comprises the hydrogenation of glycidyl polyethers of polyhydric phenols with hydrogen in the presence of a catalyst consisting of rhodium and/or ruthenium supported on an inert carrier at a temperature below about 50° C. This method is thoroughly disclosed and described in U.S. Pat. No. 3,336,241, issued Aug. 15, 1967.

The hydrogenated epoxy compounds prepared by the process disclosed in U.S. Pat. No. 3,336,241 are suitable for use in the present compositions. Accordingly, the relevant disclosure of U.S. Pat. No. 3,336,241 is incorporated herein by reference.

The second method comprises the condensation of a hydrogenated polyphenol with an epihalohydrin, such as epichlorohydrin, in the presence of a suitable catalyst such as BF$_3$, followed by dehydrohalogenation in the presence of caustic. When the phenol is hydrogenated Bisphenol A, the resulting saturated epoxy compound is sometimes referred to as "diepoxidized hydrogenated Bisphenol A", or more properly as the diglycidyl ether of 2,2-bis(4-cyclohexanol)propane.

In any event, the term "saturated epoxy resin", as used herein shall be deemed to mean the glycidyl ethers of polyhydric phenols wherein the aromatic ring structure of the phenols have been or are saturated.

Preferred saturated epoxy resins are the hydrogenated resins prepared by the process described in U.S. Pat. No. 3,336,241. More preferred are the hydrogenated glycidyl ethers of 2,2-bis(4-hydroxyphenyl)propane, sometimes called the diglycidyl ethers of 2,2-bis(4-cyclohexanol)propane.

Other examples include the glycidyl novolac resins, i.e., the glycidyl phenol-aldehyde condensates, as described in U.S. Pat. No. 2,658,885.

Epoxy Curing Agent

Suitable epoxy curing agents include the alkaline and acidic materials which are normally epoxy curing agents. Examples of suitable curing agents include, among others, the polybasic acids and their anhydrides, such as, for example, the di, tri- and higher carboxylic acids as oxalic acid, phthalic acid, terephthalic acid, succinic acid, alkyl and alkenyl-substituted succinic acids, tartaric acid, and particularly the polymerized unsaturated acids, such as, for example, those containing at least 10 carbon atoms, and preferably more than 14 carbon atoms, as for instance dodecenedioic acid, 10,12-eicosadienedioic acid, and anhydrides as phthalic anhydride, succinic anhydride, maleic anhydride, nadic anhydride, pyromellitic anhydride and the like.

Other types of acids that are useful are those containing sulfur, nitrogen, phosphorus or halogens; benzene phosphinic, sulfonyl dipropionic acid bis(4-carboxyphenyl)amide.

Other preferred curing agents include the amino-containing compounds, such as, for example, diethylene triamine, triethylene tetramine, dicyandiamide, melamine, pyridine, cyclohexylamine, benzyldimethylamine, benzylamine, diethylaniline, triethanolamine, piperidine, tetramethylpiperazine, N,N-dibutyl-1,3-propane diamine, N-N-diethyl-1,3-propane diamine, 1,2-diamino-2-methylpropane, 2,3-diamino-2-methylbutane, 2,3-diamino-2-methylpentane, 2,4-diamino-2,6-dimethyloctane, dibutylamine, dioctylamine, dinonylamine, distearylamine, diallylamine, dicyclohexylamine, methylethylamine, ethylcyclohexylamine, pyrrolidine, 2-methylpyrrolidine, tetrahydropyridine, 2-methylpiperidine, 2,6-dimethylpiperidine, diaminopyridine, tetramethylpentane, meta-phenylene diamine and the like, and soluble adducts of amines and poly-epoxides and their salts, such as described in U.S. Pat. Nos. 2,651,589 and 2,640,037. Still other examples include the acetone soluble reaction products of polyamines with unsaturated nitriles, such as acrylonitrile, imidazoline compounds as obtained by reaction monocarboxylic acids with polyamine, sulfur and/or phosphorus-containing polyamines as obtained by reacting a mercaptan or phosphine containing active hydrogen with an epoxide halide to form a halohydrin, dehydrochlorinating and then reacting the resulting product with a polyamine, soluble reaction product of polyamines with acrylates, and many other types of reaction products of the amines.

Still other curing agents that may be used include boron trifluoride and complexes of boron trifluoride with amines, ethers, phenols and the like, Friedel Crafts metal salts, such as aluminum chloride, zinc chloride, and other salts, such as zinc fluoborate, magnesium perchlorate and zinc fluosilicate; inorganic acids and partial esters as phosphoric acid and partial esters thereof including n-butyl orthothiophosphate, diethyl orthophosphate and hexaethyletetraphosphate and the like.

Another type of curing agent to be employed incudes the polyamides containing active amino and/or carboxyl groups, and preferably those containing a plurality of amino hydrogen atoms. Examples of polybasic materials used in making these polyamides include, among others, 1,10-decanedioic acid, 1,12-dodecanedienedioic acid, 1,20-eicosadienedioic acid, 1,14-tetradecanedioic acid, 1,18-octadecanedioic acid and dimerized and trimerized fatty acids as described above. Amines used in making the polyamides include preferably the aliphatic and clcloaliphatic polyamines as ethylene diamine, diethylene triamine, triethylene tetramine, tetraethylene pentamine, 1,4-diaminobutane, 1,3-diaminobutane, hexamethylene diamine, 3-(N-isopropylamino)propylamine and the like. Especially preferred polyamides are those derived from the aliphatic polyamides containing no more than 12 carbon atoms and polymeric fatty acids obtained by dimerizing and/or trimerizing ethylenically unsaturated fatty acids containing up to 25 carbon atoms. These preferred polyamides have a viscosity between 10 and 750 poises at 40° C., and preferably 20 to 250 poises at 40° C. Preferred polyamides also have amine values of 50 to 450.

Still another group of curing agents are those based on melamine reaction products containing methylol substituents.

Still other suitable curing agents comprise the imidazoles and benzimidazoles as well as adducts thereof with epoxy resins. Suitable such imidazoles and adducts therefrom are described in U.S. Pat. No. 3,756,984.

Especially preferred epoxy curing agents are the amino-containing compounds such as the aliphatic, cycloaliphatic, aromatic amines and polyamines as well as the polyamides and the like.

The amount of curing agent may vary considerably depending upon the particular agent employed. In general, the acids, anhydrides, polyamides, polyamines, polymercaptans, etc., are preferably utilized in at least 0.6 chemical equivalent amounts, and preferably 0.8 to 2.0 equivalent amounts. An equivalent amount refers to that amount needed to give one active H (or anhydride group) per epoxy group.

Various conventional additives may be included in the epoxy adhesive blend such as solvents, curing agent accelerators, antioxidants, fungicides, diluents, pigments, fillers, fibrous materials, dyes, resins, polyolefins, plasticizers, extenders, etc.

The temperature employed in the cure will vary depending chiefly on the type of curing agent. The amino-containing curing agents generally cured at or near room temperature although temperatures up to about 120° C. may be used. The acids, anhydrides, and melamine derivatives, on the other hand, are generally used for heat cures, such as temperatures ranging from 100° C. to about 250° C. Preferred temperatures range from about 60° C. to about 150° C.

To illustrate the manner in which the invention may be carried out, the following examples are given. It is understood, however, that the examples are for the purpose of illustration only and that the invention is not to be regarded as limited to any of the specific conditions or reactants recited therein. Unless otherwise indicated, parts and percentages are by weight.

The relative perfectness of the copper-benzotriazole derivative complexes was composed by counting the number of defects per unit area (defect density) after the coated copper substrated was dipped into an aqueous silver nitrate solution. Silver spots occur where bare copper surface is exposed.

The torsional joint test was made on the epoxy-copper bond by a technique described in Lin, C. J. and Bell, J. P., J. Polymer Science, 16, pp 1721 (1972). It is believed that this type of joint yields more useful information on bond strength than other current methods such as lap-joints, circular butt or tubular butt joints as described in McCarvell, W. T. and Bell, J. P., J. Adhesion, 6, pp 185 (1974). The torsional tests of the joints were performed using an Instron Universal Testing Instrument, Table Model TM-S.

The water resistance of the copper-epoxy adhesion was evaluated by exposing the joints to steam or boiling water for up to 850 hours and testing on the Instron instrument. The joint strength was measured as the maximum force to break in torsion (breakage force in pounds).

Polyepoxide A is glycidyl polyether of 2,2-bis(4-hydroxy phenyl)propane having an average molecular weight of 380 and an epoxy equivalent weight of 185–195.

5-ABTA is 5-amino-benzotriazole
5-HBTA is 5-hydroxy-benzotriozole
5-GBTA is 5-glycidoxy-benzotriazole
BTA is 1-H-benzotriazole
5-CBTA is 5-carboxy-benzotriazole
5-NBTA is 5-nitro-benzotriazole
DAB is 1,4-diaminobutane
MPDA is meta-phenylene diamine
MDA is methylene-dianiline
VERSAMID 140 TM is a commercially available polyaminoamide derived from the condensation of dimer fatty acids and polyamines.
$\sigma$ is standard deviation.

EXAMPLE I

This example illustrates the preparation of 5-aminobenzotriazole (5-ABTA).

5-ABTA was prepared from 5-NBTA by reduction in 100% ethanol medium under hydrogen atmosphere. 10.0 g of 5-NBTA was dissolved in 300 ml of 100% ethanol. To prepare a homogeneous solution, the mixture was boiled for 10 minutes with refluxing. After 5-NBTA was completely dissolved, the solution was cooled down to room temperature. 1.0 g of 5% palladium coated active carbon hydrogenation catalyst (Ventron Product Co.) was added, and the whole mixture was placed on a Paar Pressure Reaction Instrument connected to a 500 ml glass reaction bottle and a hydrogen cylinder. The reaction bottle is shaken by an electric motor. The initial hydrogen pressure was set at 60 psi. After 24 hours, the pressure dropped to 42 psi. The reaction product was filtered three times with Whatman #2 filter paper to remove the catalyst. The remaining solid, after the ethanol was evaporated, was dissolved in 100 ml of boiling distilled water. The aqueous solution was dark-red. 4.0 g of active charcoal was added to the aqueous solution for decolorization. After stirring for 5 minutes, the active charcoal was removed by filtration. Unreacted 5-NBTA was also removed because the solubility of 5-NBTA in water is very low compared with that of 5-ABTA. The measured solubility of 5-NBTA by a separate experiment was 0.041 g in 100 ml of water at 100° C. The solubility of 5-ABTA was not measured. But a solubility higher than 20% (solubility of BTA in water at 100° C.) can be expected for 5-ABTA. The —NH$_2$ group is expected to enhance dissolution of 5-ABTA. The —NH$_2$ group is expected to enhance dissolution of 5-ABTA in water. Finally, yellowish-white powder of 5-ABTA was obtained by recrystallizing from the aqueous solution.

EXAMPLE II

This example illustrates the preparation of a benzotriazole modified epoxy compound.

3.97 g (0.01 mole) of Polyepoxide A and 1.34 g (0.01 mole) of 5-ABTA was dissolved in 50 ml of N,N-dimethylacetamide and heated to the boiling point of the solvent (164° C.) with stirring. The reaction was checked by thin-layer chromatography (TLC) every hour. Because of the high boiling point of N,N-dimethylacetamide, the reaction products and the reactants were extracted with ethyl acetate for TLC. A small amount of the reaction mixture was taken by a capillary glass tube. It was dropped into a 5 ml test tube and 1 ml of ethyl acetate was added. After adding 3 ml of distilled water, the test tube was shaken vigorously and settled afterward. When two layers of water and ethyl acetate were formed, the lower water layer was removed by a pipette. By repeated washing with water (3 times), N,N-dimethylacetamide which is miscible with water was removed. The resulting ethyl acetate solution of reactants and products was spotted on a TLC plate (EM Reagent, Silicagel 60). Ethyl acetate was used again as solvent for TLC. After 20 hours of reaction, Epon 828 completely disappeared. Three major spots appeared at different locations. The reaction mixture was cooled down to room temperature. 600 ml of ethyl acetate was added, and N,N-dimethylacetamide was washed with a copious amount of distilled water in a separatory funnel.

The reaction product was separated by column chromatography under the following conditions.
Column: 2" dia. × 44" length
Bed: 400 g of silica gel (Mallinckrodt Silicar CC-7)
Solvent: toluene 1 + ethyl acetate 3 (by volume)
The first fraction was collected and dried on a rotary-evaporator. 1.09 g of green, viscous liquid was obtained. To confirm the structure of the product, infrared and nuclear magnetic resonance spectra were taken.

This compound is hereinafter designated as "EMDTA". (epoxy modified triazole)

EXAMPLE III

This example illustrates the preparation of 5-hydroxy benzotriazole (5-HBTA).

5.0 g (0.037 mole) of 5-ABTA was dissolved in an aqueous hydrochloric acid made of 11.2 ml of concentrated hydrochloric acid and 30 ml of distilled water. 2.72 g (0.039 mole) of sodium nitrite, NaNO$_2$ was dissolved in 50 ml of distilled water. The 5-ABTA solution was cooled down to 0° C. in an ice-salt bath. With vigorous stirring, the sodium nitrite solution was added slowly to maintain the whole mixture within the temperature range between 0° C. and 5° C. After all the sodium nitrite solution was added, the mixture showed a red color. Excess sodium nitrite was detected by starch-iodine paper, and destroyed with several drops of 50% aqueous urea solution. When the diazotization reaction was completed, the solution was placed in a 90° C. oven. The replacement reaction proceed while water was evaporated. A dark-red solid was obtained after 15 hours of drying. It was moved to an extraction thimble and extracted with ethyl acetate for 24 hours. The solution, concentrated to about 3 ml, was separated in a column under the following conditions:

Column: 2" dia. × 44" length
Bed: 400 g of silica gel (Mallinckrodt Silicar CC-7)
Solvent: ethyl acetate: 3 + chloroform: 1 (by volume)
The first fraction was collected and dried. Bright yellow crystals were obtained.

EXAMPLE IV

This example illustrates the defect density on the copper-benzotriazole complex layer.

Pure electrolytic hard copper sheet of 2 mm thickness, 99.92% OFHC (oxygen free hard copper), was cut into a size of 1 cm × 1 cm and mounted on Buehler Red Bakelite mounting material for ease of polishing. The surface was polished with 240, 400, and 600 grit Buehler Polishing Papers successively. To prepare a copper mirror, polishing was continued with No. 1, 2, and 3 Buehler Alumina Slurries on rotating microcloth discs. The No. 3 Alumina Slurry, which was used for final polishing, has a particle size of 0.03 micron. The specimen was washed with distilled water and dried with reagent grade methanol. After polishing, the copper mirror was demounted. Because of limited solubility of EMBTA in water, reagent grade acetone was used as solvent and the reaction temperature was fixed at the boiling point of acetone (56° C.). There is no substantial difference in reactivity of BTA in various solvents[18] as long as polar organic solvents are used. To prepare a copper-BTA derivative complex on the surface of the specimen, it was dipped into a boiling acetone solution of the compound. In order to minimize the concentration change during reaction, a reflux condenser was attached. After the desired time for complex formation, the specimen was removed from the solution and washed with acetone and air dried. The dried specimen was dipped in a $1 \times 10^{-3}$ molar aqueous silver nitrate solution for 10 minutes, and washed with distilled water and dried with acetone. Defects on the CuBTA complex layer were observed as silver spots under an optical microscope (Xenon 450 Research II Metallograph, Bausch & Lomb).

Five photographs were taken at a magnification of 10X. On each photograph, five different areas of 1 cm × 1 cm were selected randomly. The number of defects in the area were counted and averaged. Defect densities were calculated as the number of defects per square centimeter.

Representative data are tabulated in Table I.

TABLE I

| Compound | Immersion Time | Defect Density* |
|---|---|---|
| Benzotriazole | 2 min. | $4.6 \times 10^2$ |
| EMBTA | 2 min. | $11.48 \times 10^3$ |
|  | 1 hour | $9.1 \times 10^3$ |
|  | 10 hours | $4.3 \times 10^3$ |
|  | 36 hours | $9.0 \times 10^2$ |
| 5-ABTA | 2 min. | $5.1 \times 10^2$ |
| 5-HBTA | 2 min. | $7.3 \times 10^2$ |

Concentration of the compounds: $2.8 \times 10^{-4}$M acetone solution
Silver deposition: 10 minutes in a $1 \times 10^{-3}$M aqueous silver nitrate solution
*Number of defects per 1 cm$^2$ of copper surface

EXAMPLE V

This example illustrates the evaluation of the adhesive joint by the torsional joint test noted hereinbefore for several benzotriazole-based pretreatment coupling agents and various epoxy adhesive systems.

The following adhesive systems were evaluated:
(1) DAB + Polyepoxide A (1:1 molar ratio)
(2) Versamid 140 + Polyepoxide A (1:2 by weight)
(3) Dicyandiamide (~4 phr) + Polyepoxide A DAB and Versamid 140 were easily mixed with the resin because both the resin and the curing agents are liquid. But the solid curing agent dicyandiamide could not be easily mixed and the following procedure was employed.

30 g of dicyandiamide, 300 g of Polyepoxide A and 200 ml of chloroform were placed in a ball-mill jar and tumbled at about 30 rpm for 72 hours. After mixing was completed, the mixture was moved to a 1,000 ml round-bottom flask and the chloroform was evaporated on a rotary evaporator. The resulting mixture contained 10 parts of dicy per 100 parts of the resin. The same procedure was repeated to prepare a mixture containing 4 parts of dicy per 100 parts of resin using 12 g of dicy. Dicyandiamide reacts with an epoxy resin only when it is heated over 150° C. The single pot epoxy adhesive mixed by this method seemed stable for over 4 months.

The two parts (rim- and flat-part) of the joint were polished with Buehler No. 2 Alumina Slurry (0.5 microns), washed with a copious amount of distilled water and reagent grade methanol, and dried with hot air from a laboratory heat-gun. It is important to keep the gap between the two parts of the joint constant (0.010"). In order to keep the gap constant and to prevent the edges from rounding by repeated polishing, the joints were remachined on a lathe after they had been used three times. A weight of 44.0 ± 0.1 mg of the adhesive was applied on the rim-part of the joint and the flat-part was placed over it. The pretreatments with coupling agents were performed by dipping the polished joints in solutions of various concentrations and temperatures. The pretreatment conditions are described on the corresponding tables. The glued joints were cured in an Instron ® oven preset at the desired temperature. When the curing reaction was completed, the oven was turned off and cooled down to room temperature. The door of the oven was kept open to accelerate cooling. To evaluate water resistance, the cured joints were exposed to steam or dipped in boiling water for various times up to 850 hours.

The strength of the joint was measured on an Instron Universal Testing Machine at a cross-head speed of 0.02" per minute. The maximum force in pounds when the joint was broken by applied torque was recorded as the joint strength.

The ultimate shear stress (Tmax) is calculated as follows:

$$\tau_{max} = \frac{16 (M_t) D_o}{\pi (D_o^4 - D_i^4)}$$

where $M_t$ is applied torque and $D_o$ and $D_i$ are the outer and inner diameters of the shaft, respectively.

The results of representative experimental evaluations are presented in Tables II, III, IV, V and VI.

TABLE II

Adhesive: Versamid 140 + Polyepoxide A

TABLE II-continued

Pretreatment: 36 hrs at 56° C. (conc.: $2.8 \times 10^{-4}$M acetone solution)
Curing: 3 hrs at room temperature
3 hrs at 100° C.

| Joint No. | Untreated | EMDTA Treated | 5-GTBA Treated |
|---|---|---|---|
| 1 | 227 | 280 | 271 |
| 2 | 200 | 280 | 284 |
| 3 | 228 | 285 | 275 |
| 4 | 260 | 274 | 275 |
| 5 | 231 | 285 | 285 |
| Avg. | 229.2 lbs. | 276.8 lbs | 281.6 lbs |

After 16 hrs. steam exposure:

| Joint No. | Untreated | EMDTA Treated | 5-GTBA Treated |
|---|---|---|---|
| 1 | 46 | 60 | 92 |
| 2 | 64 | 64 | 86 |
| 3 | 58 | 82 | 81 |
| 4 | 30 | 85 | 64 |
| 5 | — | 61 | 82 |
| Avg. | 49.5 lbs | 70.4 lbs | 79.0 lbs |
| % Decrease | 78.4% | 76.3% | 76.9% |

TABLE III

Adhesive: Versamid 140 + Polyepoxide A
Pretreatment: Pure Benzotriazole, 10 Min. 100° C.
Conc. $2.8 \times 10^{-4}$M
Curing: 3 hrs at room temperature
3 hrs at 100° C.

| Joint No. | Breakage Force (lbs.) |
|---|---|
| 1 | 240 |
| 2 | 251 |
| 3 | 247 |
| 4 | 242 |
| 5 | 250 |
| Avg. | 246.0 |

After 24 hrs steam exposure:

| Joint No. | Breakage Force (lbs) |
|---|---|
| 1 | 240 |
| 2 | 224 |
| 3 | 233 |
| 4 | 229 |
| 5 | 232 |
| Avg. | 231.6 |
| % decrease | 5.9% |

TABLE IV

Pretreatment: 10 min., 100° C. aq. BTA ($2.8 \times 10^{-4}$M)
Adhesive: 4 phr dicyandiamide in Polyepoxide A
Curing: 2 hrs at 350° F.

| | Breakage Force (lbs)[a] | | | | |
|---|---|---|---|---|---|
| Joint No. | dry | 22 hrs | 54 hrs | 74 hrs | 110 hrs |
| 1 | 327 | 262 | 240 | 247 | 200 |
| 2 | 338 | 263 | 218 | 270 | 235 |
| 3 | 383 | 240 | 208 | 230 | 200 |
| 4 | 374 | 242 | 239 | 245 | 241 |
| Avg. | 355.5 | 262.5 | 226.3 | 248.0 | 218.8 |
| | ($\sigma$: 27.2) | ($\sigma$: 16.7) | ($\sigma$: 15.8) | ($\sigma$: 16.5) | ($\sigma$: 21.75) |

[a]Hours in boiling water.
$\sigma$ = standard deviation.

TABLE V

Pretreatment: 5-HBTA, $2.8 \times 10^{-3}$ acetone solution at 56° C. for 10 min.
Adhesive: 4 phr dicyandiamide in Polyepoxide A
Curing: 2 hrs at 175° C.

| | Breakage force (lbs)[a] | | | | |
|---|---|---|---|---|---|
| Joint No. | dry | 24 hrs | 48 hrs | 72 hrs | 100 hrs |
| 1 | 357 | 271 | 256 | 166 | 179 |
| 2 | 364 | 278 | 251 | 184 | 165 |
| 3 | 352 | 269 | 246 | 162 | 173 |
| 4 | 360 | 266 | 261 | 177 | 163 |

TABLE V-continued

Pretreatment: 5-HBTA, $2.8 \times 10^{-3}$ acetone solution at 56° C. for 10 min.
Adhesive: 4 phr dicyandiamide in Polyepoxide A
Curing: 2 hrs at 175° C.

| | Breakage force (lbs)[a] | | | | |
|---|---|---|---|---|---|
| Joint No. | dry | 24 hrs | 48 hrs | 72 hrs | 100 hrs |
| Avg. | 358.3 | 271.0 | 253.5 | 172.3 | 170.0 |
| | ($\sigma$: 5.06) | ($\sigma$: 5.1) | ($\sigma$: 6.45) | ($\sigma$: 10.1) | ($\sigma$: 7.4) |

[a]Hours in boiling water.

TABLE VI

Adhesive: Polyepoxide A + diaminobutane (1:1 mixture)
Curing: 5 hrs at room temperature and
5 hrs at 100° C.
Pretreatment: (a) 30 hrs at 56° C. (conc. of coupling-agent is $2.8 \times 10^{-4}$ mole in acetone)
(b) no pretreatment

| | Breakage Force (lbs) | | |
|---|---|---|---|
| Joint No. | EMDTA Treated | 5-GTBA Treated | No Pretreatment |
| 1 | 260 | 280 | 227 |
| 2 | 248 | 263 | 200 |
| 3 | 209 | 269 | 260 |
| 4 | 224 | 243 | 224 |
| 5 | — | — | 231 |
| Avg. | 233.3 | 263.8 | 229.2 |

After 16 hrs. steam exposure:

| | Breakage Force (lbs) | | |
|---|---|---|---|
| Joint No. | EMDTA Treated | 5-GTBA Treated | No Pretreatment |
| 1 | 80 | 74 | 46 |
| 2 | 42 | 30 | 64 |
| 3 | 65 | 62 | 58 |
| 4 | 57 | 54 | 30 |
| Avg. | 61 | 55.3 | 49.5 |
| % Decrease | 76.3% | 76.9% | 78.4% |

EXAMPLE VI

This example illustrates the cathodic polarization pretreatment of the copper surface. Representative results are tabulated in Table VII.

TABLE VII

Adhesive: 4 phr dicyandiamide with Polyepoxide A
Curing: 2 hrs at 350° F.
Electrolyte: 100 ml of 0.3% aq. KOH solution
+ 100 ml of 0.02 M aq. BTA solution
Joints were polarized cathodically (applied potential: 4V for 10 min.) and kept for 10 min.
pH: 10.1 (adjusted by 10% NaOH solution)
Temp: 22° C.

| | breakage force (lbs) | |
|---|---|---|
| Joint No. | dry | 24 hrs in boiling water |
| 1 | 357 | 304 |
| 2 | 362 | 295 |
| 3 | 382 | 287 |
| 4 | 366 | 290 |
| Avg. | 366.8 | 294.0 |

EXAMPLE VII

This example illustrates that when dicyandiamide is used as the curing agent for the epoxy resin, good adhesion is obtained even when the copper substrate has not been pretreated. Representative results are tabulated in Table VIII.

TABLE VIII

Pretreatment: None
Adhesive: 4 phr dicyandiamide in Polyepoxide A
Curing: 2 hr at 350° C.

| | Breakage force (lbs) | | | | |
|---|---|---|---|---|---|
| Joint No. | Dry | 24 hrs | 48 hrs | 80 hrs | 100 hrs[b] |
| 1 | 596 | 254 | 264 | 251 | 210 |
| 2 | 498 | 244 | 220 | 216 | 220 |
| 3 | 567 | 266 | 224 | 238 | 184 |
| 4 | 572 | 245 | 246 | 211 | 213 |
| Avg. | 558.3 | 252.3 | 238.5 | 229.0 | 206.8 |
| | ($\sigma$: 42.0) | ($\sigma$: 10.2) | ($\sigma$: 20.5) | ($\sigma$: 18.8) | ($\sigma$: 15.7) |

[a] In boiling water
[b] Pretreatment with 5-ABTA gives a bond which requires a breakage force of 260 lbs. after 100 hours in boiling water.

EXAMPLE VIII

This example illustrates the improvement obtained in epoxy-copper adhesion in boiling water when the copper substrate has been pretreated with a preferred compound, 5-amino-benzotriazole. The results are tabulated in Table IX.

TABLE IX

Pretreatment: 10 min. in a $2.0 \times 10^{-3}$M aq. 5-amino-benzotriazole solution at room temperature.
Adhesive: Polyepoxide A
100 parts + 4 parts of dicyandiamide (based on 4.7 phr of a proprietary curing agent containing a mixture of dicyandiamide and an adduct of Epoxy Resin A and 2-methyl-inidozole)
Curing: 2 hours at 175° C.

| | No Pretreatment Breakage Force (lbs) | | | | | Pretreatment with 5-ABTA Breakage Force (lbs) | | | | |
|---|---|---|---|---|---|---|---|---|---|---|
| Joint No. | Dry | 24 | 51 | 110 | 840* | Dry | 24 | 54 | 110 | 840* |
| 1 | 360 | 257 | 200 | 123 | 70 | 373 | 296 | 243 | 236 | 194 |
| 2 | 352 | 255 | 221 | 185 | 65 | 362 | 282 | 252 | 224 | 179 |
| 3 | 360 | 266 | 248 | 113 | 81 | 378 | 286 | 257 | 246 | 157 |
| 4 | 367 | 263 | 242 | 186 | — | 387 | 268 | 248 | 233 | — |
| Avg. | 359.8 | 260.3 | 227.8 | 151.8 | 72.0 | 370.0 | 283.0 | 250.0 | 235.3 | 176.7 |
| $\sigma$ | 5.3 | | 18.9 | | 6.7 | 6.6 | 10.0 | 5.1 | 8.6 | 15.2 |

*Hours in boiling water

EXAMPLE IX

This example illustrates the improvement obtained in epoxy-copper adhesion in boiling water when the copper substrate has been pretreated with 5-amino-benzotriazole and the adhesive is (a) m-phenylenediamine/-Polyepoxide A and (b) methylenedianiline/Polyepoxide A. The results are tabulated in Tables X and XI.

TABLE X

Adhesive: m-phenylenediamine + Polyepoxide A (1:1 equivalent ratio)
Curing: 1 hour at 120° C. and 3 hours at 150° C.
Pretreatment: 10 min. in a $2 \times 10^{-4}$M 5-ABTA aq. solution at room temperature

| | Breakage Force (lbs)* | |
|---|---|---|
| Joint No. | Control | 5-ABTA Treated |
| 1 | 49 | 125 |
| 2 | 21 | 96 |
| 3 | 65 | 98 |
| Avg. | 45.0 | 106.3 |
| $\sigma$ | 18.2 | 13.2 |

*After 24 hours immersion in boiling water

TABLE XI

Adhesive: methylenedianiline + Polyepoxide A (1:1 equivalent ratio)
Curing: 1 hour at 120° C. and 3 hours at 150° C.
Pretreatment: 10 min. in a $2 \times 10^{-4}$M 5-ABTA aq. solution

| | Breakage Force (lbs)* | |
|---|---|---|
| Joint No. | Control | 5-ABTA Treated |
| 1 | 77 | 203 |
| 2 | 41 | 190 |
| 3 | 121 | 143 |
| Avg. | 79.7 | 178.7 |
| $\sigma$ | 32.7 | 25.8 |

*After 24 hours immersion in boiling water

What is claimed is:

1. A process for improving the adhesion of epoxy resins to a copper substrate which comprises (1) subjecting the substrate to cathodic polarization of from about 1 to about 15 volts for from about one second to about 15 minutes in an electrolytic bath and then immersing the polarized substrate in a 0.001 to 0.1 molar solution of at least one compound of the general formula:

$$X-\underset{Y}{\underset{|}{\bigcirc}}\overset{A}{\underset{B-D}{|}}$$

wherein
A is a —N= or —S—,
B is a —N= or —C=,
Y is a —N= or NH=,
D is H, —SH, —SR, $$-S-\overset{O}{\overset{\|}{C}}-(CH_2)_m-SH,$$

or R wherein R is an alkyl or aryl radical, and m is an integer from 0 to 10, and X is H, —NH$_2$, $$-\overset{O}{\overset{\|}{C}}-OH, -CH_2-OH, -CH_2-O-CH_2-\overset{O}{\overset{/\backslash}{CH}}-CH_2,$$

$$-O-CH_2-\overset{O}{\overset{/\backslash}{CH}}-CH_2,$$

or —OH for from about 1 second to about one hour.

2. The process of claim 1 wherein the compound is a benzothiozole of the general formula:

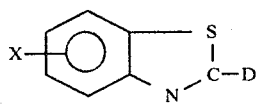

wherein X and D are defined as in claim 1.

3. The process of claim 2 wherein X is hydrogen.
4. The process of claim 2 wherein X is —NH$_2$.
5. The process of claim 2 wherein X is an —OH.

6. The process of claim 2 wherein X is a

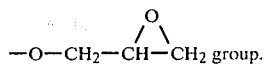

7. The process of claim 1 wherein the solvent is a polar solvent.
8. The process of claim 7 wherein the polar solvent is a ketone.
9. The process of claim 1 wherein the compound is 5-aminobenzotriazole.

* * * * *